United States Patent [19]

Steele

[11] Patent Number: 5,523,705

[45] Date of Patent: Jun. 4, 1996

[54] APPARATUS AND METHOD FOR SELECTING AND BUFFERING INPUTS OF PROGRAMMABLE LOGIC DEVICES

[75] Inventor: Randy C. Steele, Folsom, Calif.

[73] Assignee: Intel Corporation, Santa Clara, Calif.

[21] Appl. No.: 419,063

[22] Filed: Apr. 10, 1995

Related U.S. Application Data

[63] Continuation of Ser. No. 111,195, Aug. 24, 1993, abandoned.

[51] Int. Cl.⁶ .................................................. H03K 19/177
[52] U.S. Cl. ........................... 326/39; 326/41; 326/44; 327/408
[58] Field of Search ......................... 307/465, 463, 307/475, 243; 326/39, 40, 41, 47, 105–106, 62, 44; 327/407–408

[56] References Cited

U.S. PATENT DOCUMENTS

| | | | |
|---|---|---|---|
| 4,706,216 | 11/1987 | Carter | 365/94 |
| 4,772,811 | 9/1988 | Fujioka et al. | 307/465 |
| 4,847,612 | 7/1989 | Kaplinsky | 326/39 |
| 4,963,768 | 10/1990 | Agrawal et al. | 307/465 |
| 5,221,865 | 6/1993 | Phillips et al. | 307/465 |
| 5,243,599 | 9/1993 | Barrett et al. | 307/243 |

*Primary Examiner*—Edward P. Westin
*Assistant Examiner*—Jon Santamauro
*Attorney, Agent, or Firm*—Blakely, Sokoloff, Taylor & Zafman

[57] ABSTRACT

A programmable logic circuit having a routing matrix capable of providing 100% connectability and routability of a plurality of input signals to their appropriate configuration function blocks. In the present invention, input signals are first routed through the routing matrix before being processed by the input buffers. Thus, a slow user signal is processed by the relatively slow routing matrix before being provided with increased drive by the input buffers and passed on to the faster logical blocks. A number of programmable control bits are stored in SRAM. These control bits are decoded to determine which of the transmission gates of the routing matrix should be enabled. In this manner the input signal is routed to the appropriate configuration function block. Following the routing matrix is the input buffer. The highly driven output signal from the buffer is then passed to the configuration function block which performs the programmed logic functions on the signal.

18 Claims, 9 Drawing Sheets

APPARATUS AND METHOD FOR SELECTING AND BUFFERING INPUTS OF PROGRAMMABLE LOGIC DEVICES

This is a continuation of application Ser. No. 08/111,195, filed Aug. 24, 1993, now abandoned.

FIELD OF THE INVENTION

The present invention pertains to the field of programmable logic devices. More particularly, the present invention relates to an apparatus and method for selecting and buffering inputs of programmable logic devices.

BACKGROUND OF THE INVENTION

Circuit designers have at their disposal, a variety of different methods of implementing their circuit designs. One method involves incorporating their designs in dedicated custom integrated circuits (ICs). The initial cost is relatively high and the turn-around time for producing a first set of these semiconductor chips is relatively long. Another method involves the implementation of application-specific integrated circuits (ASICs). Time to market for ASICs are faster, and it is easier to implement design changes. A third alternative, which enjoys growing popularity, is utilizing programmable logic devices (PLDs).

A PLD is a semiconductor chip that contains an array of gates having programmable interconnections. The gates are programmed according to the specification provided by the circuit designer. In PLDs, the desired logic functions are implemented by using standard product terms (p-terms). This involves first performing an AND function on the input variables and then forming the sum of the products, usually by performing an OR function. Typically, a standard number of p-terms are input to one or more programmable output structures, known as a macrocells. The p-terms are derived by using a piece of hardware, known as a programmer. A programmer is typically coupled by a serial port to a microcomputer, on which some form of programmer software is run. The simplest kind of software enables a designer to select which fuses to burn. The designer decides the desired logic function, at the gate level, then lists the corresponding fuses. Other more sophisticated programmers allow designers to specify Boolean expressions or truth tables. The software handles the minimization, simulation, and programming steps automatically. This yields custom combination and even sequential logic on a PLD chip.

Historically, when PLDs were first introduced, they tended to be simple and were rather limited in the functions that they could perform. Typically, input signals were transmitted through bond pads of the PLD chip to an electrostatic protection network. Next, the input signals were buffered to enable the PLD to handle both transistor-to-transistor logic (TTL) as well as complementary metal oxide semiconductor (CMOS) signals. Following the input buffers was a programmable interconnect matrix for routing the various input signals to the appropriate macrocells. This scheme worked fine for moderate PLD designs.

However, due to advances in semiconductor technology, PLDs have become more powerful and complex. The functions of entire blocks of circuitry can be performed by a single PLD. Today, modern PLDs are several times larger than their predecessors. As the total number of inputs to the PLD and the number of macrocells for processing all these inputs increase, the routing matrix must also grow correspondingly in size. This large routing matrix acts as a huge capacitive load. Whereas the input buffers of prior art PLDs only had to drive a relatively small routing matrix, additional drive capability is required in order to properly drive the tremendous load associated with present day routing matrices. Hence, several stages of input buffers are presently being implemented for providing the requisite drive.

However, the downside to this approach is that the additional drivers introduce significant delays in the signal path. Moreover, the additional buffering increases die size which translates into higher production costs. Furthermore, once the input signals have been buffered to provide for increased drive capability, it would be beneficial to pass these highly driven signals through the routing matrix to the logic circuits of the PLD. The problem is that, in order to do this, the switches within the routing network must be made large enough to handle the large amounts of current associated with these signals. The routing network is comprised of upwards of tens of thousands of such switches. Increasing the size of all these switches substantially increases the PLD's die size. A bigger die size means that less dies (i.e., chips) can be fabricated per wafer. Hence, the cost per chip goes up.

If smaller switches were used in the routing matrix, then additional buffers need be implemented after the routing matrix so as to build the signals back up again. These additional buffers consume valuable die area as well as introduce addition delays in the signal path.

Thus, there is a need in the prior art for a PLD design which provides high-speed routing of input signals with the requisite degree of current for properly driving the PLD's circuits. It would be preferable if the routing matrix of such a design were 100% connectable and routable. It would also be preferable if the design could be implemented with minimal impact to die size.

SUMMARY OF THE INVENTION

The present invention is directed towards an apparatus and method for selecting and buffering input signals for programmable logic circuits such as programmable logic devices, gate arrays, field programmable gate arrays, etc. In the present invention, input signals are directed through a routing matrix before being processed by an input buffer. By placing the input buffers after the routing matrix, slow user signals are initially processed by the relatively slow routing matrix. Once the input signal has been routed to its correct destination, the input buffer provides the input signal with increased drive before passing the signal on to the configuration function block. Thereby, the configuration function block can perform the programmed logic functions on the input signal in a faster fashion given the requisite degree of drive.

In the currently preferred embodiment, a number of programmable control bits are stored in SRAM. One set of these control bits are decoded in order to determine which one of the transmission gates of a first stage multiplexer is to be enabled. Another set of control bits is decoded to determine which one of the transmission gates of a second stage multiplexer is to be enabled. By implementing two stages, each individual stage need not be made as wide. The input buffers are coupled between the second stage multiplexers and the configuration function blocks. Thus, one out of over a hundred different possible inputs can be selectively coupled to any of the configuration logic blocks. In addition, this input signal is provided with the requisite degree of drive by the input buffer prior to processing by the configuration function block.

BRIEF DESCRIPTION OF THE DRAWINGS

The present invention is illustrated by way of example, and not by way of limitation, in the Figures of the accompanying drawings and in which like reference numerals refer to similar elements and in which.

DETAILED DESCRIPTION

A programmable logic circuit having an apparatus and method for selecting and buffering input signals is described. In the following description, for purposes of explanation, numerous specific details are set forth, such as control bits, buffer circuitry, routing matrix configuration, etc., in order to provide a thorough understanding of the present invention. It will be obvious, however, to one skilled in the art that the present invention may be practiced without these specific details. In other instances, well-known structures and devices are shown in block diagram form in order to avoid unnecessarily obscuring the present invention. Furthermore, the present invention can be applied to programmable logic devices, gate arrays, field programmable gate arrays, and other similar types of programmable logic circuits.

Figure 1:
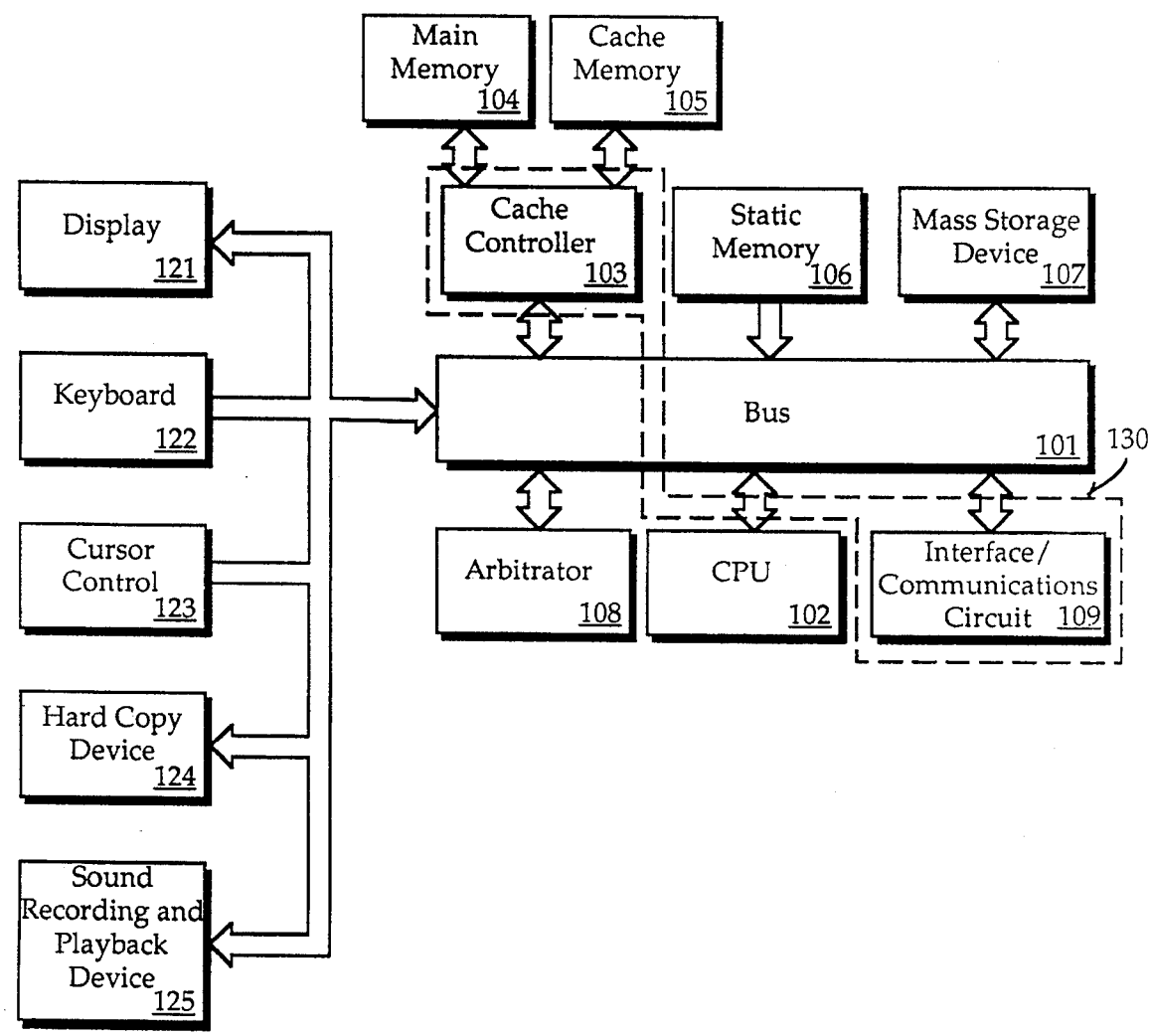
FIG. 1 illustrates a computer system upon which a PLD utilizing the present invention can be implemented.

Programmable logic circuits can be implemented to perform various functions. For example, PLD's can be programmed to act as cache controllers, DRAM controllers, interface and/or communications devices, bus arbitrators, etc. Referring to FIG. 1, a computer system upon which a PLD utilizing the present invention can be implemented is shown. The computer system comprises a bus or other communication means 101 for communicating information. A central processing unit (usually a microprocessor) is used for processing information and is coupled onto bus 101. Furthermore, a number of co-processors 103 can be coupled onto bus 101 for additional processing power and speed. The computer system 100 further comprises a cache controller 103 coupled to bus 101 for accessing either the main memory 104 or cache memory 105. Main memory 104 is comprised of random access memory (RAM) or some other dynamic storage device which is used in storing information and instructions to be executed by CPU 102. Main memory 104 also may be used for storing temporary variables or other intermediate information during execution of instructions by CPU 102. The cache memory 105 comprises fast static random access memories (SRAMs) for temporarily storing the latest memory accesses.

The computer system also comprises a read only memory (ROM) and/or other static storage device 106 coupled to bus 101 for storing permanent information and instructions for processor 102. A data storage device 107 such as a hard, floppy, or optical disk drive can be coupled to bus 101 for storing information and instructions.

Also coupled to bus 101 are bus arbitrator 108 and interface/communications circuit 109. Bus arbitrator 108 is used to control the transmission and receipt of data on bus 101. Interface/communications circuit 109 is used to interface the computer system to another system, such as a computer network.

The computer system can be coupled to various devices. For example, a display device, 121, such as a cathode ray tube (CRT) can be coupled to bus 101 for displaying information to a computer user. An alphanumeric input device 122, including alphanumeric and other keys, may also be coupled to bus 101 for communicating information and command elections to processor 102. A cursor control 123 is coupled to bus 101 for communicating direction information and command selections to processor 102, and for controlling cursor movement on display 121. A cursor control device can include a mouse, trackball, joystick, touchpad, etc. This input device typically has two degrees of freedom in two axes, a first axis (e.g., x) and a second axis (e.g., y) which allows the device to specify any position in a plane.

As an example, the cache controller 103 and the interface/communications circuit 109 may be realized by a PLD implementing the present invention. Given a relatively large PLD and a simple cache controller and interface/communications circuit, a single PLD may suffice. This PLD is represented by the dashed line 130. PLD 130 accepts control signals over bus 101 from the CPU as well as from external sources. PLD 130 is programmed to provide the appropriate output signals to the state machines associated with cache controller 103 and interface/communications circuit 109. This is performed according to a number of product terms, which are programmed into the PLD.

Figure 2:
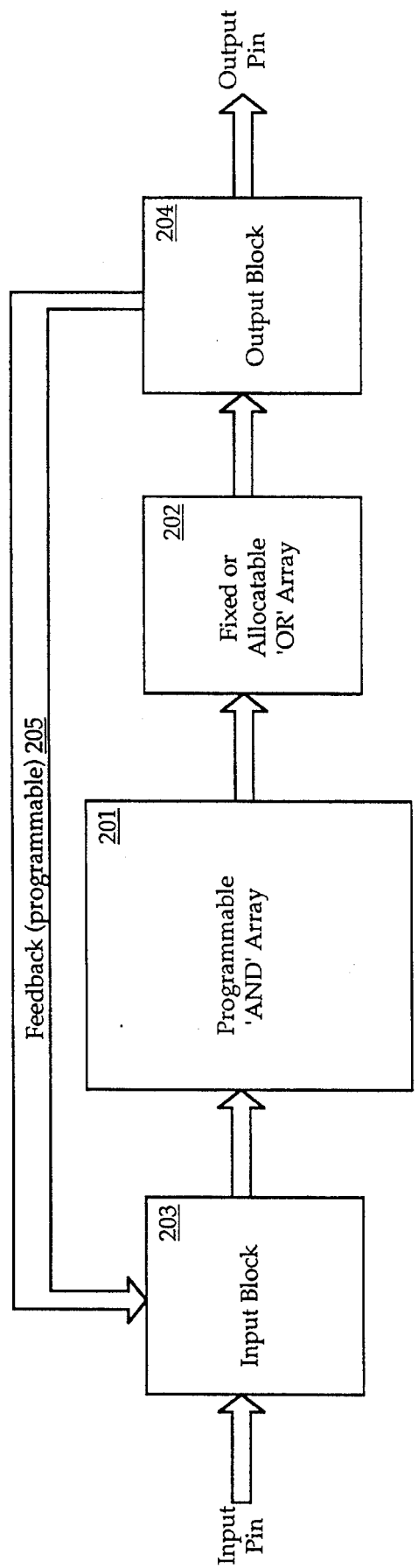
FIG. 2 is a block diagram of the general architecture of a PLD upon which the present invention may be practiced.

FIG. 2 is a block diagram of the general architecture of a PLD upon which the present invention may be practiced. The PLD is internally structured as a variation of the PLA architecture —an array of programmable AND gates 201 is coupled to a fixed or allocatable array of OR gates 202. PLDs make use of the fact that any logic equation can be converted to an equivalent sum-of-products (SOP) form. Hence, logic equations can be implemented in an AND/OR architecture. The basic PLA structure is augmented with input block 203 and output block 204. Input block 203 is comprised of an electrostatic protection network, multiplexers for routing various input signals, input buffers, and various programmable input options. As described in detail below, the present invention is primarily implemented in input block 203. According to the present invention, input block 203 is configured wherein the input buffers are placed after the multiplexers such that the input signals are first fed directly into the multiplexers. It is only after the signals are finished being processed by the multiplexers that they are then buffered and sent to the rest of the logic circuits of the PLD. Output block 204 is comprised of output controls, registers, etc. In addition, programmable feedback 205 allows a user to implement sequential logic functions as well as combination logic.

The number and location of the programmable connections between the AND and OR matrices, along with the input and output blocks, are predetermined by the architecture of the PLD. The user specifies which of these connections are to remain open and which are to be closed, depending on the logic requirements. The PLD is programmed accordingly. Programmability of these connections can be achieved using various memory technologies such as fuses, EPROM cells, EEPROM cells, or static RAM cells. Typically, a user purchases a PLD off-the-shelf and by using a development system running on a personal computer, can produce a customized integrated circuit.

Figure 3:
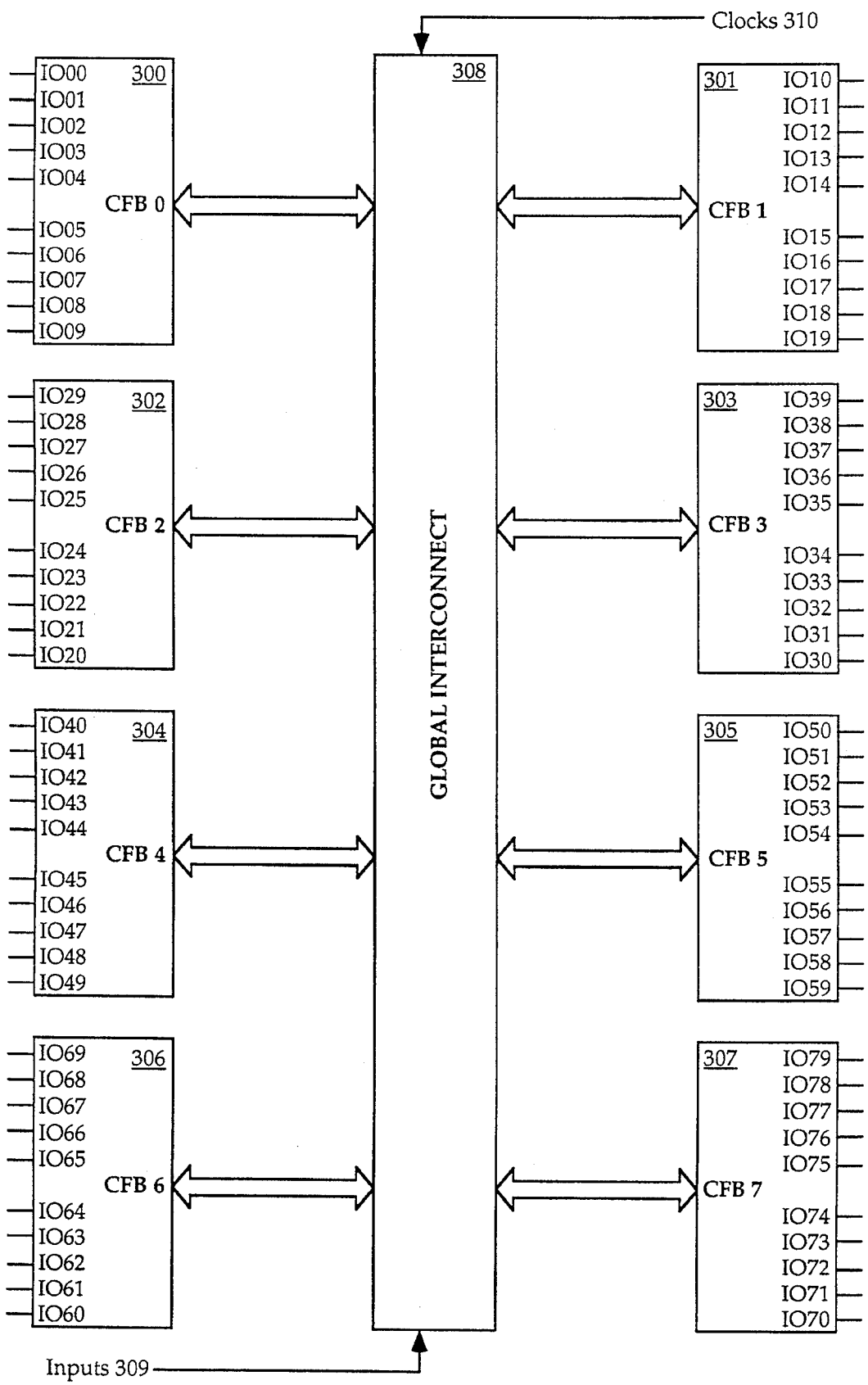
FIG. 3 is a block diagram illustrating a field programmable gate array (FPGA).

FIG. 3 is a block diagram illustrating a field programmable gate array (FPGA) upon which the present invention can be practiced. The FPGA is comprised of eight configurable function blocks (CFBs) 300–307 coupled together by a global interconnect 308. Each of the CFBs is similar to a PLA. Data 309 and clock 210 lines are input to CFBs 300–307 via global interconnect 308. Global interconnect 308 is comprised of a bus having an interconnecting matrix which renders each of the CFB blocks connectable. Any combination of signals in the matrix can be routed to any CFB block, up to the maximum fan-in of the block. In other words, 100% connectability and routability for each of the input signals is provided. Also included are a number of buffers following the interconnecting matrix. These buffers process the input signals so that they have the requisite degree of drive before being passed on to the CFBs. Thereby, input signals having slow rise times are propagated through the slower parts of the PLD (e.g., the interconnection matrix) before being processed by the buffers for faster operations by the CFBs.

The CFBs 300–307 accept 24 bit wide inputs from global interconnect 308. Based on the inputs and the programmability up to ten outputs can be generated per CFB. In other words, 80 outputs IO0–IO79 can be generated by the eight CFBs 300–307. This type of device is known as a 24V10, where the "V" connotes variable programming.

The PLD is powered by a 5.0 supply voltage on the $V_{cc}$ pin. $V_{ss}$ is ground. In addition, in the currently preferred embodiment of the present invention, there is a separate $V_{cco}$ pin associated with each of the CFB's 300–307 (i.e., eight $V_{cco}$ pins). The $V_{cco}$ pins correspond to the output supply voltage. By coupling the desired output voltage to a $V_{cco}$ pin, a user can select the voltage level of signals being output from a particular CFB.

In the currently preferred embodiment of the present invention, the global interconnect block 308 has eighty I/O, eighty feedback, twenty-two input, and two $V_{cc}/V_{ss}$ lines. Hence, there are a total of one hundred and eighty-four separate interfaces to the interconnect block 308.

Figure 4:
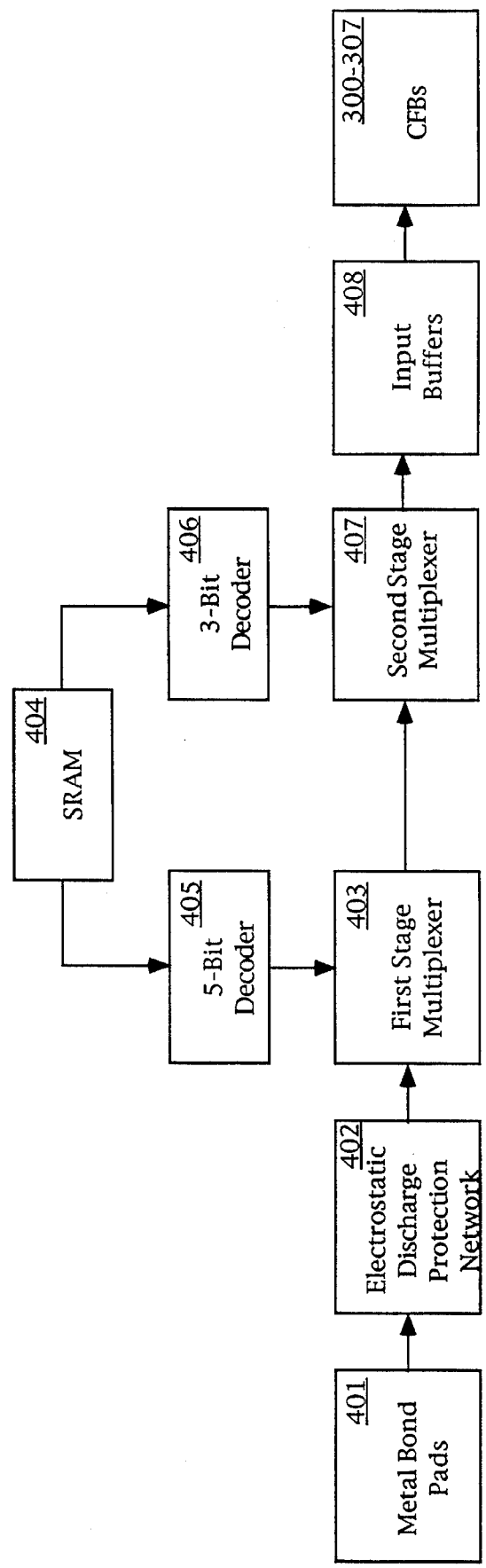
FIG. 4 is a block diagram showing the various blocks which comprise the interconnection matrix.

FIG. 4 is a block diagram showing the various blocks which comprise the interconnection matrix. Initially, a user's signals are input to the PLD via the metal bond pads 401. These signals are then sent through an electrostatic discharge protection network 402. Thereafter, the various input signals are routed by the routing matrix to the appropriate CFB. The routing matrix is comprised of two multiplexer (MUX) stages 403–407. Two stages are used in order to lessen the load relative to any one particular transmission gate. If only one stage were implemented, then that single stage would have to cover all one hundred and eighty four different possibilities for routing a given input signal. As a result, a single transistor corresponding to the chosen path would be loaded with the other one hundred and eighty three transistors. And even though these other transistors are turned off, they nonetheless, impose a junction capacitance and a gate overlap capacitance. Unless each of the one hundred and eighty-four transmission gates is made relatively large, it is difficult to properly drive such a large capacitive load. Thus, it is beneficial to implement a two-stage MUX, wherein the first stage is of a limited width. Note that the first stage MUX shouldn't be made too narrow or else the second stage MUX would have to be made that much wider, and two devices are now driving a large load. In the currently preferred embodiment, the first MUX stage 403 has thirty-two transmission gates. Five control bits are used to control these thirty-two transmission gates. A five-bit decoder 405 is used to decode which of these thirty-two transmission gates is to be enabled. This determination is made according to the five control bits stored in SRAM 404.

The second MUX stage 407 is comprised of six transmission gates. These six transmission gates are controlled by three control bits. These three control bits are stored in SRAM 404. Based upon these three control bits, the three-bit decoder block 406 determines which of the six transmission gates of the second MUX stage is to be enabled. Thereby, a total of one hundred and ninety-two different routing possibilities are possible. Consequently, this setup is more than sufficient to cover the one hundred and eighty-four possible signals. The output from the second stage multiplexer 407 is fed into one of the input buffers 408 which provide the signal with the requisite degree of drive before being sent to the logic circuits of one of the eight CFB 300–307. It is important to note that in the present invention, the input buffers are implemented after the MUXes (i.e., between the MUXes and the CFBs).

Figure 5:
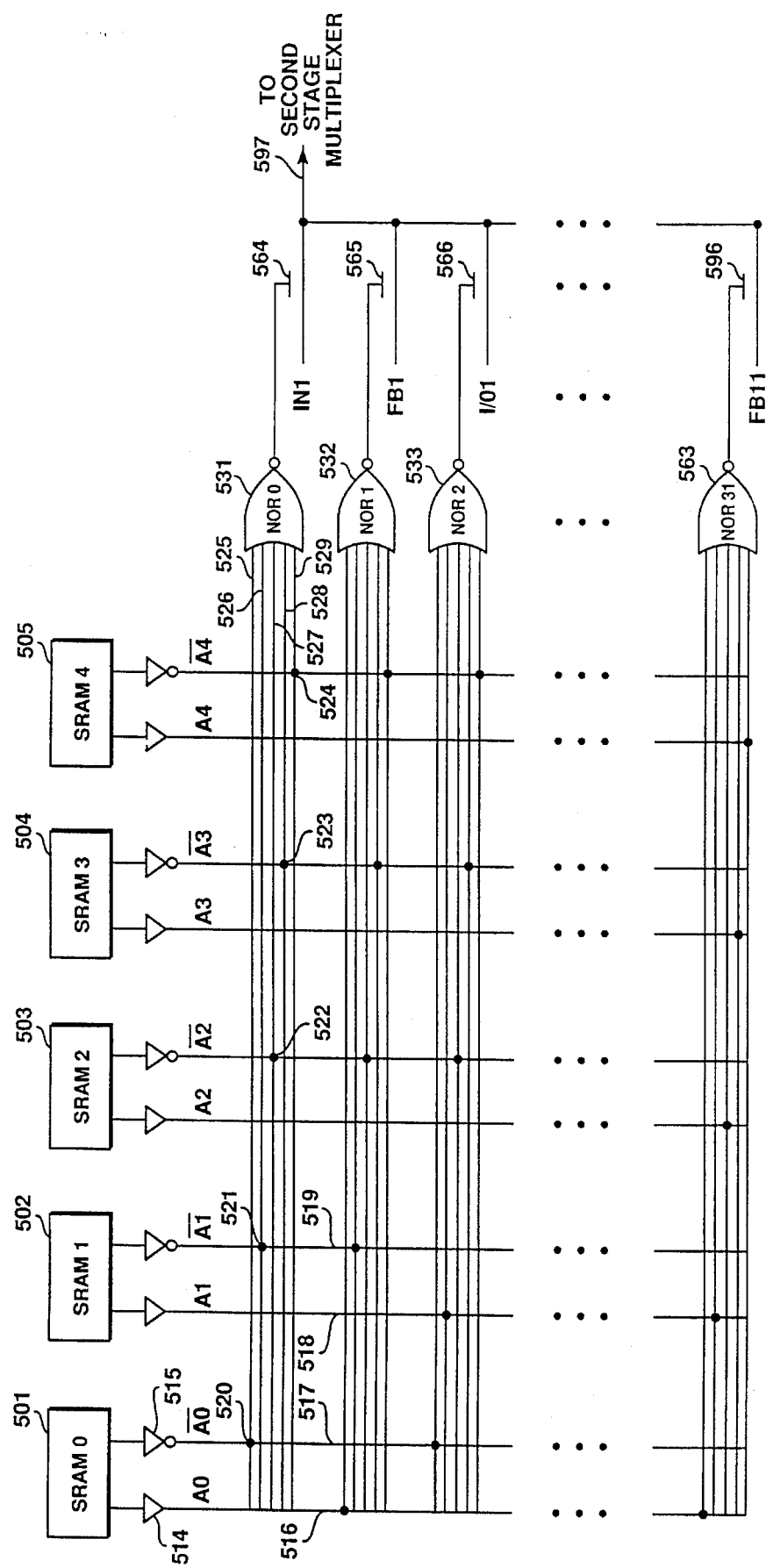
FIG. 5 is a circuit diagram showing the SRAMs, a five-bit decoder, and a first stage multiplexer associated with one of the CFBs.

FIG. 5 is a circuit diagram showing the SRAMs, a five-bit decoder, and a first stage multiplexer associated with one of the CFBs. The five control bits for controlling the first stage multiplexer are stored in the SRAM cells 501–505. Each SRAM cell stores one bit. There are two outputs from each of the five SRAM cells. One output is driven onto a non-inverting line, while the other output is driven onto an inverting line. For example, SRAM0 has one of its outputs coupled to a non-inverting driver 514. SRAM0 also has an output which is coupled to inverter 515, which inverts the control signal. This inverted control signal is driven onto line 517. Similarly, a non-inverted control signal from SRAM1 is driven onto line 518, and an inverted control signal from SRAM1 is driven onto line 519.

Thus, with five control bits, $2^5=32$ routing lines can be controlled. Table 1 below lists how these five control bits are decoded to control the thirty-two transmission gates of the first stage MUX.

TABLE 1

| | Five-Bit Decoder | | | | |
|---|---|---|---|---|---|
| A0 | A1 | A2 | A3 | A4 | "1" Output |
| 0 | 0 | 0 | 0 | 0 | NOR0 |
| 1 | 0 | 0 | 0 | 0 | NOR1 |
| 0 | 1 | 0 | 0 | 0 | NOR2 |
| 1 | 1 | 0 | 0 | 0 | NOR3 |
| 0 | 0 | 1 | 0 | 0 | NOR4 |
| 1 | 0 | 1 | 0 | 0 | NOR5 |
| 0 | 1 | 1 | 0 | 0 | NOR6 |
| 1 | 1 | 1 | 0 | 0 | NOR7 |
| 0 | 0 | 0 | 1 | 0 | NOR8 |
| 1 | 0 | 0 | 1 | 0 | NOR9 |
| 0 | 1 | 0 | 1 | 0 | NOR10 |
| 1 | 1 | 0 | 1 | 0 | NOR11 |
| 0 | 0 | 1 | 1 | 0 | NOR12 |
| 1 | 0 | 1 | 1 | 0 | NOR13 |
| 0 | 1 | 1 | 1 | 0 | NOR14 |
| 1 | 1 | 1 | 1 | 0 | NOR15 |
| 0 | 0 | 0 | 0 | 1 | NOR16 |

TABLE 1-continued

| Five-Bit Decoder | | | | | |
|---|---|---|---|---|---|
| A0 | A1 | A2 | A3 | A4 | "1" Output |
| 1 | 0 | 0 | 0 | 1 | NOR17 |
| 0 | 1 | 0 | 0 | 1 | NOR18 |
| 1 | 1 | 0 | 0 | 1 | NOR19 |
| 0 | 0 | 1 | 0 | 1 | NOR20 |
| 1 | 0 | 1 | 0 | 1 | NOR21 |
| 0 | 1 | 1 | 0 | 1 | NOR22 |
| 1 | 1 | 1 | 0 | 1 | NOR23 |
| 0 | 0 | 0 | 1 | 1 | NOR24 |
| 1 | 0 | 0 | 1 | 1 | NOR25 |
| 0 | 1 | 0 | 1 | 1 | NOR26 |
| 1 | 1 | 0 | 1 | 1 | NOR27 |
| 0 | 0 | 1 | 1 | 1 | NOR28 |
| 1 | 0 | 1 | 1 | 1 | NOR29 |
| 0 | 1 | 1 | 1 | 1 | NOR30 |
| 1 | 1 | 1 | 1 | 1 | NOR31 |

Either the non-inverting or the inverting output from each of the five SRAM cells 501–505 is coupled to each of the thirty-two five-input NOR gates 531–563. The determination as to whether the non-inverting or inverting input is to be coupled for each input of each of the NOR gates is made according to Table 1 above. A "0" indicates that the inverted output signal is to be coupled to that particular NOR gate, while a "1" indicates that the non-inverted output signal is to be coupled to that particular NOR gate. For example, Table 1 specifies that in order for the NOR0 to output a "1", it must receive an input of "00000." Hence, the inverting lines from SRAM cells 501–505 are input to the NOR0 gate 531. The $\overline{A0}$ output from SRAM0 cell 501 is coupled to the first input line 525 or NOR0 gate 531 by node 520. The $\overline{A1}$ output from SRAM0 cell 501 is coupled to the first input line 525 of NOR0 gate 531 by node 520. The $\overline{A1}$ output from SRAM1 cell 502 is coupled to the second input line 526 of NOR0 gate 551 by node 521. Likewise, the $\overline{A2}$ output from SRAM2 cell 503 is coupled via node 522 to the third input line 528 of the NOR0 gate 531. The $\overline{A3}$ output from the SRAM3 cell 504 is coupled via node 523 to the fourth input line 529, and the $\overline{A4}$ output from SRAM4 cell 505 is coupled via node 524 to the fifth input line 529 of NOR0 gate 531.

Therefore, if the control bits in the SRAM cells 501–505 are all "1's", then the inputs to NOR0 gate 531 are all "0's". Consequently, NOR0 gate 531 outputs a "1" to the gate of an n-channel transistor 564. This causes the n-channel transistor 564 to start conducting. As a result, the IN1 signal is output from the first stage MUX on output line 597. The IN1 signal is sent to the second stage multiplexer.

Referring back to Table 1, it can be determined that the A0, $\overline{A1}$, $\overline{A2}$, $\overline{A3}$, and $\overline{A4}$ outputs from the SRAM cells 501–505 are coupled to the five inputs of the NOR1 gate 532. Consequently, if the control bits are "10000" respectively in the SRAM cells 501–505, then NOR1 gate 532 outputs a "1". This causes the n-channel transistor 565 to turn on, and the feedback signal FB1 is output on line 597 from the first stage multiplexer. Likewise, a sequence of "01000" causes the NOR2 gate 533 to turn on the n-channel transistor 566, so that the I/O1 signal is output on line 597 from the first stage multiplexer.

It should be noted that the sequence of the five control bits which causes NOR0 gate 531 to output a "1" will necessarily cause each and everyone of the other thirty-one NOR gates 532–563 to output a "0". Similarly, the sequence of five control bits which causes NOR1 gate 532 to output a "1" will cause all the other NOR gates to output "0's". Thus, only one of the thirty-two transistors 564–596 is ever enabled at any given time. In an alternative embodiment, if a user chooses an input signal which is not connected to a given branch of the first stage multiplexer, a more sophisticated first stage multiplexer could turn off all 32 n-channels, thereby reducing the load on the unselected inputs.

Figure 6:
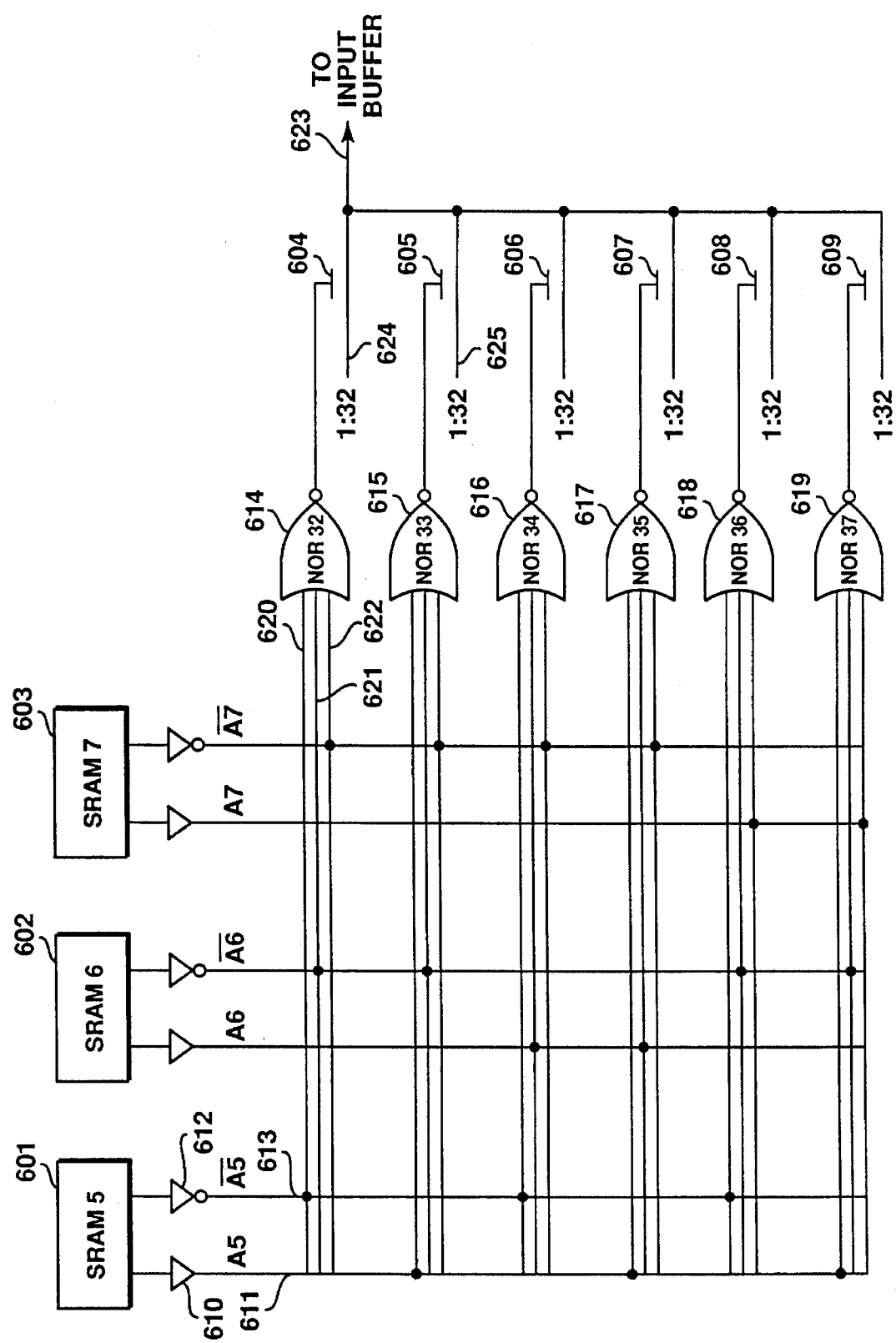
FIG. 6 is a circuit diagram showing a three-bit second stage decoder and a second stage multiplexer.

FIG. 6 is a circuit diagram showing a three-bit second stage decoder and a second stage multiplexer. Three control bits stored in the three SRAM cells 601–603 are decoded to determine which one of the six transmission gates 604–609 is to be enabled. The three control bits are decoded according to Table 2 shown below.

TABLE 2

| Three-Bit Decoder | | | |
|---|---|---|---|
| A5 | A6 | A7 | "1" Output |
| 0 | 0 | 0 | NOR32 |
| 1 | 0 | 0 | NOR33 |
| 0 | 1 | 0 | NOR34 |
| 1 | 1 | 0 | NOR35 |
| 0 | 0 | 1 | NOR36 |
| 1 | 0 | 1 | NOR37 |

Again, there are two outputs from each of the three SRAM cells 601–603. One of the two outputs is non-inverting, while the other output is inverted by an inverter. For example, the SRAM5 cell 601 has one of its outputs driven by driver 610 directly onto line 611 as the A5 signal. The other output of SRAM5 cell 601 is inverted by inverter 612 before being driven onto line 613 as the $\overline{A5}$ signal. Either the inverting or non-inverting output from each of the three SRAM cells 601–603 is coupled to each of the six three-input NOR gates 614–619. The determination as to whether the inverting or non-inverting output is to be coupled to which of the inputs of each of the six NOR gates 614–619 is made in accordance with Table 2 above. For example, the three inputs 620–622 to NOR gate 614 is coupled to the $\overline{A5}$, $\overline{A6}$, and $\overline{A7}$ inverted outputs of SRAM cells 601–603. Thus, when the control bits for SRAM cells 601–603 are "000", NOR gate 614 outputs a "1" to the gate of the n-channel transistor 604. This causes the n-channel transistor 604 to turn on, and the selected signal (i.e., one out of thirty-two signal) from the first stage multiplexer is output from the second stage multiplexer on line 623 to the input buffer. The other five NOR gates all output "0's" to the gates of the n-channel transistors 615–619, thereby turning them off. Thus, only the selected signal from the first stage multiplexer on line 624 is output from the second stage multiplexer to the input driver.

If the three control bits in SRAM cells 601–603 are "100" then the NOR33 gate 615 outputs a "1" to the gate of the n-channel transistor 605. This causes the signal selected by the first stage multiplexer corresponding to line 625 to be output from the second stage multiplexer on line 623 to the input buffer. Depending on the sequence of control bits, the signal from one of six possible different first stage multiplexers which selects among thirty-two different possible inputs is selected for output by the second stage multiplexer. In this manner, a total of 32×6=192 different possible inputs can be selected for output to the input buffer and eventually sent to be processed by one of the eight CFBs.

Figure 7:
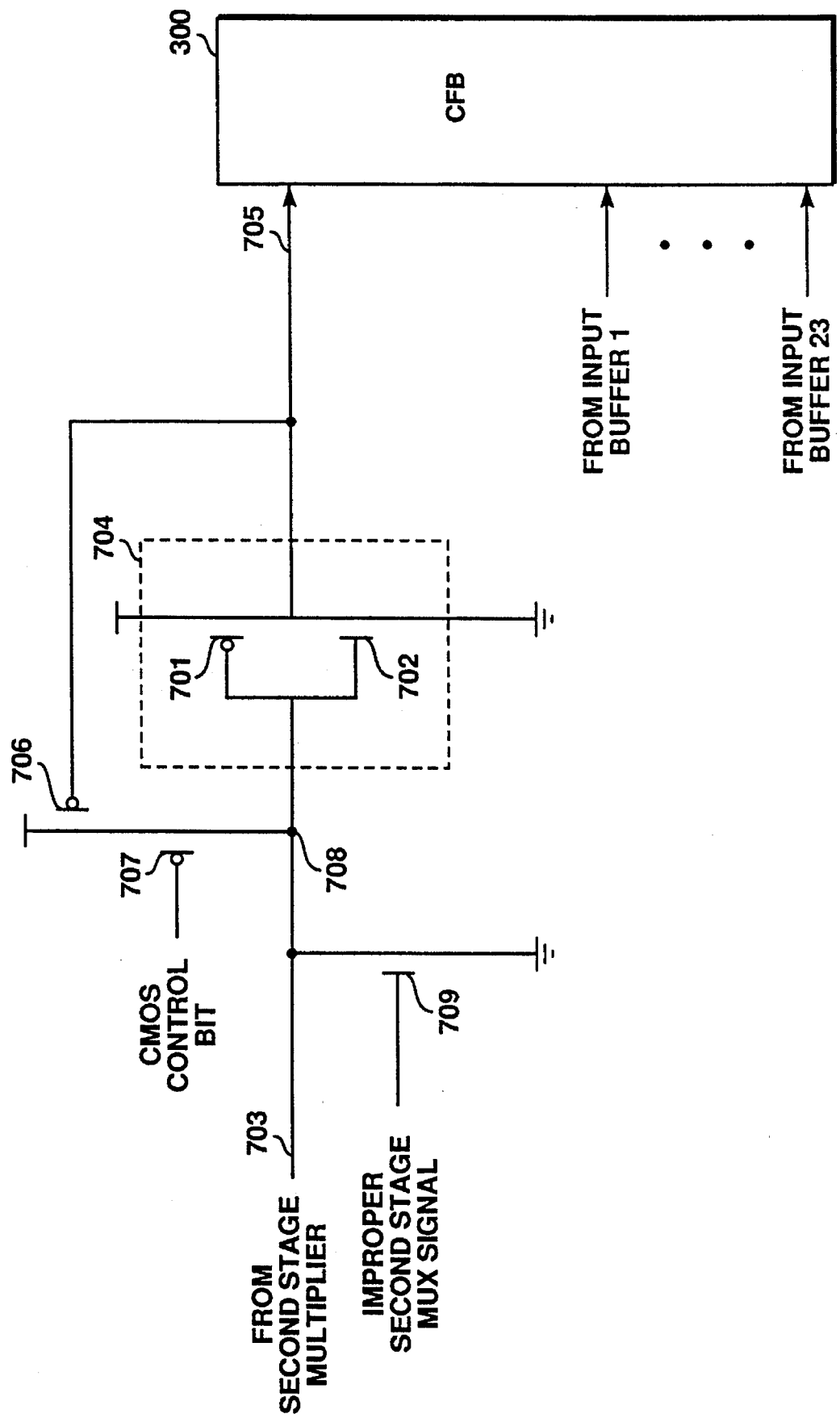
FIG. 7 is a circuit diagram showing the input buffer with associated power consumption minimization circuitry.

FIG. 7 is a circuit diagram showing the input buffer with associated power consumption minimization circuitry. The selected input signal from the second stage multiplexer is sent on line 703 to a TTL ratio inverter 704. The inverter 704 is comprised of a p-channel transistor 701 and an n-channel transistor 702. The inverter is made sufficiently large enough to permit the input signal to properly drive the CFB 300. In the currently preferred embodiment, the n-channel transistor 702 is made approximately twice the size of the p-channel transistor 701. The output signal from inverter 704 is input to CFB 300 on line 705. This output signal is also fed back to the input of inverter 704 through p-channel transistor 706.

The p-channel transistor 707 is implemented in order to minimize power consumption in case the PLD is implemented in a CMOS system. Referring back to FIGS. 5 and 6, for example if the gates of the two transistors 564 and 604 are at $V_{CC}$, then the voltage on node 703 will be limited to $V_{CC}-V_{TN}$. $V_{TN}$ can be up to 1–2 volts. If $V_{CC}$ is at 5.0 volts and TTL level inputs are used, there is no problem. However, if this circuit is running in a CMOS system having 5.0 volt input signals, there will only be 3–3.5 volts output. And unless the input signal is kept at the rail, this inverter 704 will consume excessive current.

In the currently preferred embodiment, the inverter 704 has a TTL threshold of approximately 1.5 volts (i.e., 1.5 volts trip point). If a TTL signal is being input, the voltage levels are properly centered. But if a CMOS signal is being input, its 5 volt level is greater than the TTL trip point. For CMOS applications, another control bit is used to turn on the p-channel transistor 707. If the p-channel transistor 707 is turned on, it will pull node 708 all the way up to 5.0 volts (provided that p-channel transistor 706 is also properly turned on). Thereby, the inverter 704 is kept from drawing extra current. Thus, when a user implements this design, the user knows and specifies whether certain I/O is TTL or CMOS. Software then programs a control bit (stored in SRAM) which turns on the p-channel transistor 707 for CMOS applications in order to minimize power consumption.

The n-channel transistor 709 is implemented as a safety precaution. It is used to safeguard against having a floating input to inverter 704. Since there are three control bits associated with the second stage multiplexer, there are a total of $2^3=8$ different possibilities. But there are only six NOR gates. Thus, whenever all six of the NOR gates of the second stage MUX are turned off, the n-channel transistor 709 is turned on. This effectively grounds node 708, thereby preventing the occurrence of a floating input to inverter 704.

In the currently preferred embodiment, there are a total of eight CFBs. Each CFB has twenty-four inputs. In other words, each CFB has twenty-four associated input buffers as described in detail above. Consequently, the six first stage MUXes having thirty-two transmission gates apiece; the six transmission gates associated with the second stage MUX; and the input buffer are repeated twenty-four times over for each CFB. Given eight CFBs, the two-stage MUX and input buffer arrangement is replicated one hundred and ninety-two times per PLD.

Figure 8:
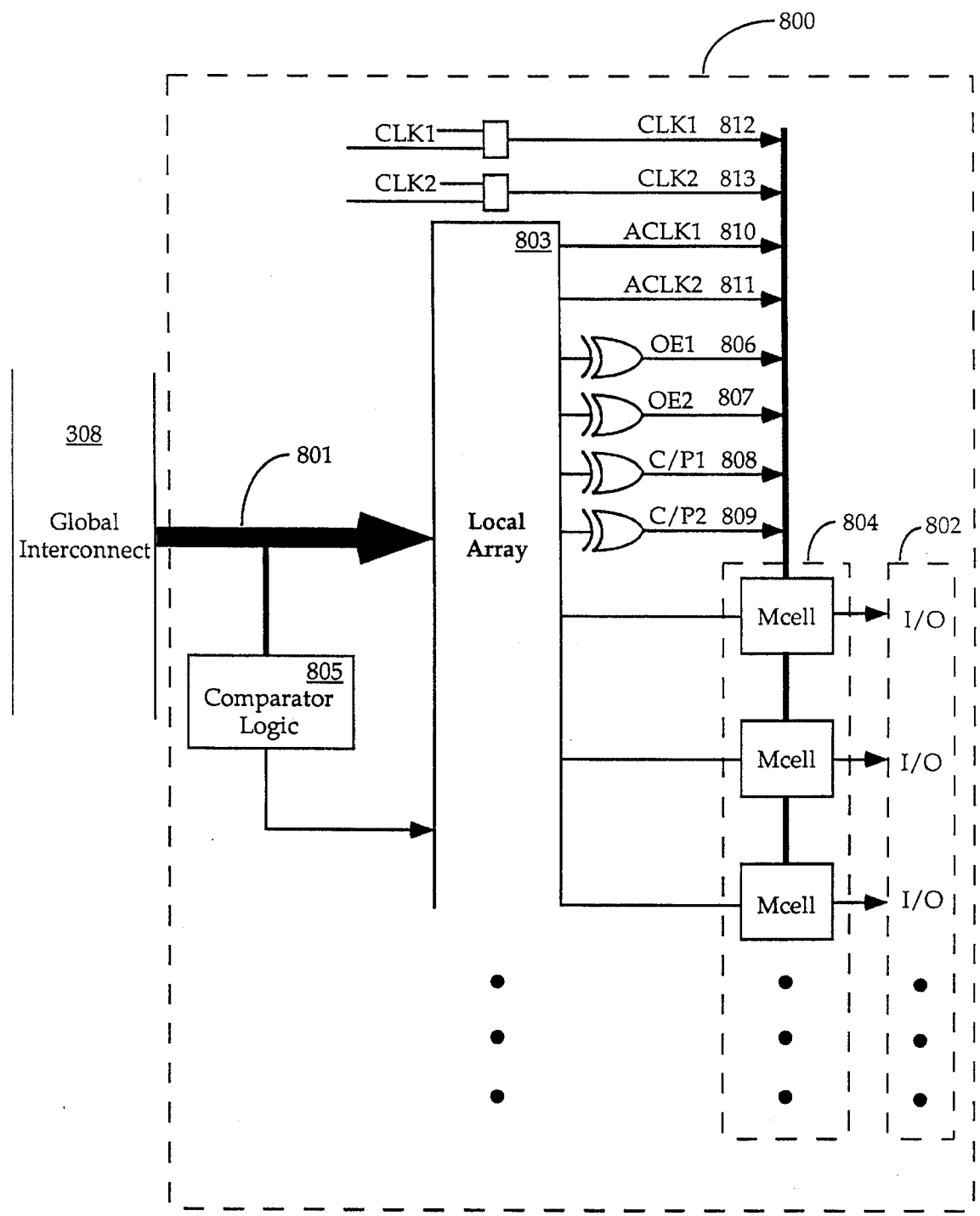
FIG. 8 is a block diagram illustrating a configurable function block.

FIG. 8 is a block diagram illustrating a configurable function block 800. The CFB is comprised of I/O 802, a local array 803, ten programmable macrocells 804, comparator logic 805, four control signals 806–809, and four clock lines 810–813. There are 66 p-terms within a CFB. A user can program any combination of the 48 inputs (i.e., 24 inputs plus their complements) independently on all 66 of the p-terms. It is these 24 inputs which are provided to the CFB via global interconnect 308 and bus 801 by the input buffers discussed above. Six of the 66 p-terms are used as control and clock signals. Lines 806 and 807 provide two output enable signals to the macrocells. Lines 808–809 provide two product terms to each of the macrocells. These two p-terms, C/P1 and C/P2, are used to clear or preset that macrocell.

The remaining 60 p-terms are distributed to the 10 outputs. Each output is driven by a macrocell. There are 10 macrocells in each CFB, one macrocell per output. Local array 803 is comprised of a programmable product term array and a p-term allocation circuit. The ten macrocells 804 can be programmed to function as an input as well as a combination, registered output, or bi-directional I/O. Each CFB also has a programmable output polarity and programmable feedback options which allow greater flexibility in meeting target applications.

Figure 9:
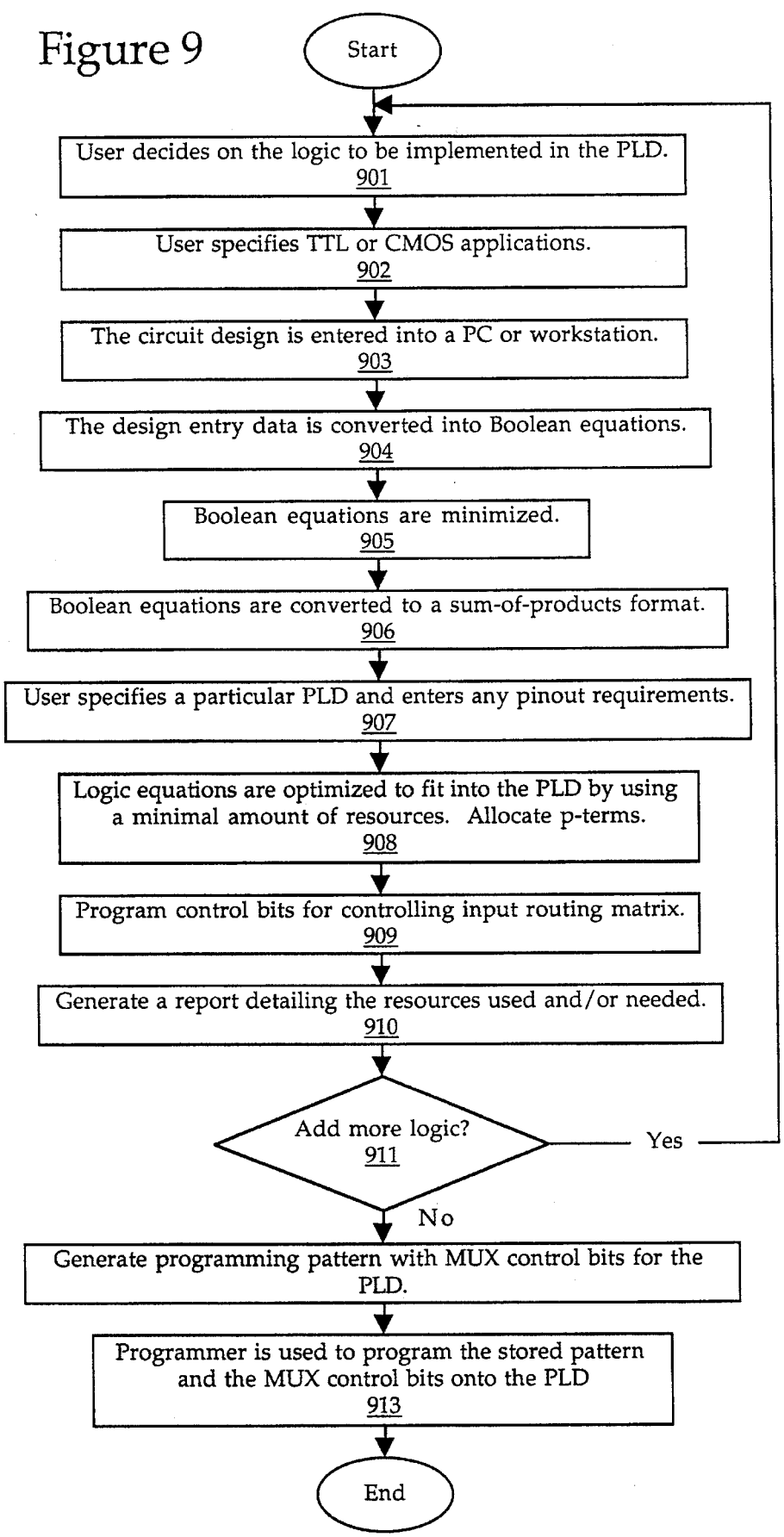
FIG. 9 is a flowchart illustrating the steps on a design process for PLDs.

FIG. 9 is a flowchart illustrating the steps on a design process for PLDs. First, the user decides on the desired logic to be implemented in the PLD, step 901. The user specifies TTL and/or CMOS applications, step 902. The circuit design is entered into a personal computer or workstation, step 903. The design entry can be accomplished by the following methods: 1) schematic capture—a mouse or some other graphic input device is used to input schematics embodying the logic, 2) net list entry—a user enters the design to the computer by describing the symbols and interconnections in words via a standardized format (i.e., a net list), 3) state equation/diagram— entry of a sequential design involving states and transitions between states (equations or a state table can also be used to define a state machine), and 4) Boolean equations which involve expressing the logic in terms of Boolean algebraic equations.

Next, the software converts all design entry data into Boolean equations (if necessary), step 904. The Boolean equations are converted to a sum-of-products (SOP) format after logic reduction, steps 905 and 906. The logic is minimized through well-known heuristic algorithms. The user can specify the particular PLD for the design to be implemented and any pinout requirements, step 907. The software optimizes the logic equations to fit into the device, using the minimum amount of resources (e.g., I/O pins, registers, product terms, macrocells, etc.), step 908. This step allocates the p-terms accordingly. Control bits are programmed to control the routing matrix in order to provide the input signals to their appropriate CFBs, step 909. A detailed report describing the resources used in fitting-the design on the PLD is generated, step 910. This allows a user to incrementally implement additional logic if there is availability, step 911. In addition, if the design overflowed the PLD (i.e., the chosen PLD does not have the resources required to implement the design), a list of the resources needed to complete the design is generated. A user can choose a larger PLD or partition the initial design into two different PLDs. The appropriate program pattern for the PLD along with the MUX control bits are generated, step 912. A programmer is used to program the stored pattern and the MUX control bits onto the PLD, step 913.

Thus, an apparatus and method for selecting and buffering input signals of programmable logic devices is disclosed.

What is claimed is:

1. A programmable logic circuit comprising:

a plurality of logic blocks for programmably performing logic functions;

a routing matrix comprising a first set of transmission gates, said first set of transmission gates directly receiving externally applied electrical signals, a first decoder coupled to said first set of transmission gates for enabling one transmission gate of said first set of transmission gates corresponding to one of said electrical signals, a second set of transmission gates coupled to said first set of transmission gates, and a second decoder coupled to said second set of transmission gates for enabling one transmission gate of said second set of transmission gates; and a buffer coupled between said routing matrix and said corresponding one of said logic blocks for driving said one of said electrical signals.

2. The programmable logic circuit of claim 1, wherein each of said externally applied electrical signals is routable to any of said logic blocks.

3. The programmable logic circuit of claim 2, wherein said buffer is comprised of an inverter having a p-channel transistor and an n-channel transistor.

4. The programmable logic circuit of claim 3, wherein said n-channel transistor is approximately two times larger than said p-channel transistor.

5. The programmable logic circuit of claim 4 further comprising a means for driving said electrical signal to a power supply rail when said electrical signal is at a CMOS voltage level.

6. The programmable logic circuit of claim 5 further comprising a static random access memory for storing a plurality of control bits, wherein said first decoder and said second decoder decodes said control bits in determining which of said transmission gates are to be enabled.

7. The programmable logic circuit of claim 6, wherein said first set of transmission gates includes at least thirty-two transmission gates and said second set of transmission gates includes at least six transmission gates, wherein at least 192 different possible inputs are routable to said one of said logical blocks.

8. In a programmable logic circuit, a method of selecting an externally applied electrical signal for processing by a logical block of said programmable logic circuit, said method comprising the steps of:

storing a plurality of control bits in a memory;

decoding said control bits for specifying at least one transmission gate of a first set of transmission gates directly receiving said electrical signal, and at least one transmission gate of a second set of transmission gates connected to said first set of transmission gates, said one transmission gate of said second set of transmission gates conducting said electrical signal to a buffer;

driving said electrical signal by said buffer to said logical block;

performing logic functions on said electrical signal by said logical block;

outputting said electrical signal after logic functions have been performed on said electrical signal.

9. The method of claim 8, wherein said electrical signal is routable to any one of a plurality of logic blocks.

10. The method of claim 9, wherein an inverter is utilized to drive said electrical signal.

11. The method of claim 10 further comprising the steps of:

determining whether said electrical signal is at a CMOS level;

coupling said electrical signal to a power supply rail to minimize power consumption by said input buffer if said electrical signal is at said CMOS level.

12. The method of claim 11 further comprising the steps of implementing a plurality of transmission gates arranged in at least two stages, wherein at least 192 different inputs are routable by said plurality of transmission gates to said logical blocks.

13. A programmable logic circuit comprising:

a plurally of logic means for programmably performing logic functions;

a first set of switching means for directly receiving a plurality of externally applied electrical signals;

a first decoder means coupled to said first set of switching means for enabling one switching means of said first set of switching means corresponding to one of said plurality of externally applied electrical signals;

a second set of switching means coupled to said first set of switching means for receiving a plurality of electrical signals from said first set of switching means;

a second decoder means coupled to said second set of switching means for enabling one switching means of said second set of switching means to conduct one of said plurality of electrical signals to a buffer means;

said buffer means coupled between said second set of switching means and one of said plurality of logic means for driving said one of said plurality of electrical signals.

14. The programmable logic circuit of claim 13, wherein each of said plurality of externally applied electrical signals is routable to any of said logic means.

15. The programmable logic circuit of claim 14, wherein said buffer means is comprised of an inverter means having a p-channel transistor and an n-channel transistor for providing drive to said electrical signal.

16. The programmable logic circuit of claim 15 further comprising a means for driving said electrical signal to a power supply rail to minimize power consumption of said buffer means when said electrical signal is at a CMOS level.

17. The programmable logic circuit of claim 16 further comprising a static random access memory means for storing a plurality of control bits, wherein said first decoder means and said second decoder means decodes said control bits in determining which of said switching means are to be enabled.

18. The programmable logic circuit of claim 17, wherein said first set of switching means includes at least thirty-two transmission gates and said second set of switching means includes at least six transmission gates, wherein at least 192 different possible inputs are routable to said one of said logic means.

* * * * *

UNITED STATES PATENT AND TRADEMARK OFFICE
CERTIFICATE OF CORRECTION

PATENT NO. : 5,523,705
DATED : June 4, 1996
INVENTOR(S) : Randy C. Steele It is certified that error appears in the above-identified patent and that said Letters Patent is hereby corrected as shown below:

In column 12 at line 7 delete "plurally" and insert --plurality--

Signed and Sealed this

Second Day of September, 1997

Attest:

BRUCE LEHMAN

*Attesting Officer*  *Commissioner of Patents and Trademarks*